(12) United States Patent
Ohara

(10) Patent No.: US 6,924,553 B2
(45) Date of Patent: Aug. 2, 2005

(54) SEMICONDUCTOR CHIP AND WIRING BOARD WITH BUMPS FORMED ON PADS/LAND AND ON PASSIVATION/INSULATION FILM AND MANUFACTURING METHOD OF THE SAME

(75) Inventor: Hiroshi Ohara, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/277,114

(22) Filed: Oct. 22, 2002

(65) Prior Publication Data

US 2003/0080420 A1 May 1, 2003

(30) Foreign Application Priority Data

Oct. 25, 2001 (JP) .......................... 2001-327237
Aug. 29, 2002 (JP) .......................... 2002-250773

(51) Int. Cl.⁷ .................. H01L 23/48; H01L 23/52; H01L 29/40
(52) U.S. Cl. .................. 257/738; 257/737; 257/739; 257/786; 257/674
(58) Field of Search .................. 257/669, 374, 257/735, 737, 738, 739, 786, 674, 778, 787, 701

(56) References Cited

U.S. PATENT DOCUMENTS

| | | | |
|---|---|---|---|
| 5,134,460 A | * 7/1992 | Brady et al. ................. 257/737 |
| 5,646,439 A | 7/1997 | Kitayama et al. | |
| 5,731,620 A | * 3/1998 | Mori ........................... 257/386 |
| 5,844,314 A | * 12/1998 | Kim ............................ 257/737 |
| 5,884,314 A | * 3/1999 | Bulusu ........................ 707/100 |
| 5,925,930 A | * 7/1999 | Farnworth et al. .......... 257/737 |
| 5,949,135 A | * 9/1999 | Washida et al. ............. 257/685 |
| 5,959,363 A | * 9/1999 | Yamada et al. .............. 257/787 |
| 6,042,953 A | 3/2000 | Yamaguchi et al. | |
| 6,083,666 A | * 7/2000 | Kim ............................. 430/315 |
| 6,426,556 B1 | * 7/2002 | Lin .............................. 257/738 |
| 6,538,326 B2 | * 3/2003 | Shimizu et al. ............. 257/758 |
| 6,583,506 B1 | * 6/2003 | Yano et al. .................. 257/737 |
| 6,806,556 B2 | * 10/2004 | Ohara ......................... 257/620 |
| 6,812,124 B2 | * 11/2004 | Weng .......................... 438/613 |
| 2001/0013651 A1 | * 8/2001 | Nakazawa ................... 257/737 |
| 2001/0040290 A1 | * 11/2001 | Sakurai et al. .............. 257/737 |
| 2002/0033531 A1 | * 3/2002 | Matsushima et al.. ...... 257/734 |
| 2002/0190395 A1 | * 12/2002 | Fang et al. .................. 257/784 |
| 2003/0052410 A1 | * 3/2003 | Sugiura ....................... 257/737 |

* cited by examiner

Primary Examiner—Nathan J. Flynn
Assistant Examiner—Victor A. Mandala, Jr.
(74) Attorney, Agent, or Firm—Oliff & Berridge, PLC

(57) ABSTRACT

An integrated circuit is electrically connected with a plurality of pads. A passivation film covers a part of each of the pads and exposes the other part of each of the pads. Bumps are formed on the pads, respectively. Each of the bumps is a single layer disposed on a part of each of the pads exposed from the passivation film, and on the passivation film.

13 Claims, 8 Drawing Sheets

SEMICONDUCTOR CHIP AND WIRING BOARD WITH BUMPS FORMED ON PADS/LAND AND ON PASSIVATION/INSULATION FILM AND MANUFACTURING METHOD OF THE SAME

This application incorporates herein by reference the entire of Japanese Application No. 2001-327237 filed on Oct. 25, 2001 and Japanese Patent Application No. 2002-250773 filed on Aug. 29, 2002.

BACKGROUND OF THE INVENTION

The present invention relates to a semiconductor chip and wiring board and method of manufacturing the same, semiconductor wafer, semiconductor device, circuit board, and electronic instrument.

Due to the advancement of high integration of semiconductor integrated circuits and size reduction of semiconductor chips, a mounting technique is required to cope with terminal connection at fine pitches. The mounting technique, readily coping with such requirement, includes TAB (Tape Automated Bonding) mounting being used for TCP (Tape Carrier Package) and flip-chip mounting being used for CSP (Chip Size Package).

In such mounting technique, bumps usually are provided on the pads of a semiconductor chip. The bump, typically an Au bump, is generally provided by an electrolytic plating method. Explained below is a method of forming an Au-bump electrode due to the electrolytic plating method.

FIG. 14 is a sectional view of an Au bump in the conventional semiconductor chip. A pad 12, as a part of wiring connected to an internal integrated circuit, is covered with a passivation film 14 in a portion except for an electrical connection surface thereof.

At first, an under-bump metal layer (lamination of barrier metal and adhesion metal layers) 1 is formed by a sputtering. Then, a resist layer 2, for forming a bump, is formed exposing an electrical connection portion of the pad 12 and it's surrounding by a photolithography technique. Next, Au is grown following a pattern of the resist layer 2 by an electrolytic plating method. After stripping the resist layer 2 away, the under-bump metal layer 1 is wet-etched depending upon a kind of the layer, through a mask of Au grown by plating. Thereafter, a bump 3 is formed through annealing and the like. Cleaning step is properly done in appropriate stages. In this manner, the bump-forming step by an electrolytic plating method takes a long time and hence requires further rationalization.

Therefore, there is a recent proposal to form a bump by an electroless plating method. In forming a bump by an electroless plating method, there is no need for a sputter and etching step for an under-bump metal layer. This can greatly reduce the step, thus realizing to form a bump at low cost. However, in the case of forming a bump by an electroless plating method, no under-bump metal layer is formed. Accordingly, there is a need to prevent water from entering to the pad.

BRIEF SUMMARY OF THE INVENTION

A semiconductor wafer according to one aspect of the present invention comprises:

a plurality of integrated circuits;

a plurality of pads electrically connected to each of the integrated circuits;

a passivation film covering a part of each of the pads and exposing the other part of each of the pads; and bumps formed on the pads, respectively, wherein each of the bumps is a single layer disposed on a part of each of the pads exposed from the passivation film, and on the passivation film.

A semiconductor chip according to another aspect of the present invention comprises:

an integrated circuit;

a plurality of pads electrically connected to the integrated circuit;

a passivation film covering a part of each of the pads and exposing the other part of each of the pads; and bumps formed on the pads, respectively, wherein each of the bumps is a single layer disposed on a part of each of the pads exposed from the passivation film, and on the passivation film.

A semiconductor device according to a further aspect of the present invention comprising:

a semiconductor chip;

a substrate on which the semiconductor chip is mounted; and an external terminal.

A circuit board according to a further aspect of the present invention has the above semiconductor chip mounted thereon.

A circuit board according to a further aspect of the present invention has the above semiconductor device mounted thereon.

An electronic instrument according to a further aspect of the present invention has the above semiconductor device.

A method of manufacturing a semiconductor chip according to a further aspect of the present invention comprises:

forming a resist layer having an opening over a central portion of a pad, on a passivation film covering the pad;

etching the resist layer to enlarge the opening while etching the passivation film using the resist layer as a mask to expose the central portion of the pad with an end portion of the pad kept covered; and forming a single-layer bump on the central portion of the pad and on the passivation film in the enlarged opening of the resist layer, by electroless plating.

A method of manufacturing a semiconductor chip according to a further aspect of the present invention comprises:

forming a resist layer having an opening over a central portion of a pad, on a passivation film covering the pad;

etching the passivation film using the resist layer as a mask to expose the central portion of the pad with an end portion of the pad kept covered;

etching the resist layer to enlarge the opening; and forming a single-layer bump on the central portion of the pad and on the passivation film in the enlarged opening of the resist layer, by electroless plating.

A method of manufacturing a semiconductor chip according to a further aspect of the present invention comprises:

forming a resist layer having an opening over a central portion of a pad, on a passivation film covering the pad;

first etching for etching the passivation film using the resist layer as a mask to expose the central portion of the pad with an end portion of the pad kept covered;

second etching for etching the resist layer except a lower end portion of the resist layer to enlarge the opening;

third etching for etching the lower end portion of the resist layer to enlarge the opening; and forming a single-layer bump on the central portion of the pad and on the passivation film in the enlarged opening of the resist layer, by electroless plating.

A method of manufacturing a semiconductor chip according to a further aspect of the present invention comprises:

forming a first resist layer having a first opening over a central portion of a pad, on a passivation film covering the pad;

etching the passivation film using the first resist layer as a mask to expose the central portion of the pad with an end portion of the pad kept covered;

removing the first resist layer;

forming a second resist layer having a second opening greater than the central portion of the pad so that the central portion of the pad and part of the passivation film are placed in the second opening; and forming a single-layer bump on the central portion of the pad and on the passivation film in the second opening of the second resist layer, by electroless plating.

A method of forming a wiring board according to a further aspect of the present invention comprises:

forming a resist layer on an insulating film covering a land which is a part of an interconnecting pattern, the resist layer having an opening over a central portion of the land;

etching the resist layer to enlarge the opening while etching the insulating film using the resist layer as a mask to expose the central portion of the land with an end portion of the land kept covered; and forming a single-layer bump on the central portion of the land and on the insulating film in the enlarged opening of the resist layer, by electroless plating.

A method of forming a wiring board according to a further aspect of the present invention comprises:

forming a resist layer on an insulating film covering a land which is a part of an interconnecting pattern, the resist layer having an opening over a central portion of the land;

etching the insulating film using the resist layer as a mask to expose the central portion of the land with an end portion of the land kept covered; and etching the resist layer to enlarge the opening; and forming a single-layer bump on the central portion of the land and on the insulating film in the enlarged opening of the resist layer, by electroless plating.

A method of forming a wiring board according to a further aspect of the present invention comprises:

forming a resist layer on an insulating film covering a land which is a part of an interconnecting pattern, the resist layer having an opening over a central portion of the land;

first etching for etching the insulating film using the resist layer as a mask to expose the central portion of the land with an end portion of the land kept covered;

second etching for etching the resist layer except a lower end portion of the resist layer to enlarge the opening;

third etching for etching the lower end portion of the resist layer to enlarge the opening; and forming a single-layer bump on the central portion of the land and on the insulating film in the enlarged opening of the resist layer, by electroless plating.

A method of manufacturing a wiring board according to a further aspect of the present invention comprises:

forming a first resist layer on an insulating film covering a land which is a part of an interconnecting pattern, the first resist layer having a first opening over a central portion of the land;

etching the insulating film using the first resist layer as a mask to expose the central portion of the land with an end portion of the land kept covered;

removing the first resist layer;

forming a second resist layer having a second opening greater than the central portion of the land so that the central portion of the land and part of the insulating film are placed in the second opening; and forming a single-layer bump on the central portion of the land and on the insulating film in the second opening of the second resist layer, by electroless plating.

A wiring board according to a still further aspect of the present invention comprises:

an interconnecting pattern having a land;

an insulating film covering a part of the land and exposing the other part of the land; and a bump formed on the land, wherein the bump is a single layer disposed on a part of the land exposed from the insulating film, and on the insulating film.

DETAILED DESCRIPTION OF THE EMBODIMENT

Figure 1A:
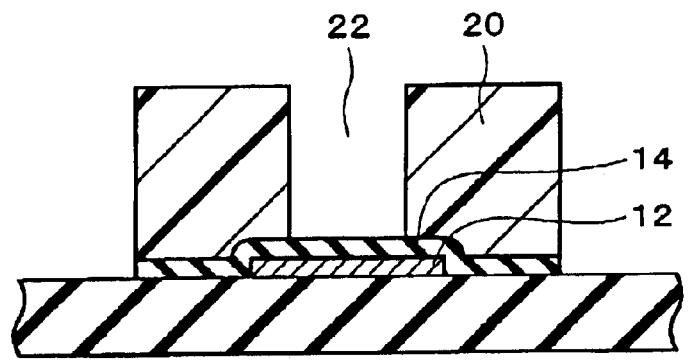
FIGS. 1A to 1D describe a method of manufacturing a semiconductor chip according to a first embodiment of the present invention.

Embodiments of the present invention may provide forming a bump to prevent water from permeating to an underlying layer in respect of a semiconductor chip and wiring board and method of manufacturing the same, semiconductor wafer, semiconductor device, circuit board and electronic instrument.

(1) A semiconductor wafer according to an embodiment of the present invention comprises:

a plurality of integrated circuits;

a plurality of pads electrically connected to each of the integrated circuits;

a passivation film covering a part of each of the pads and exposing the other part of each of the pads; and bumps formed on the pads, respectively, wherein each of the bumps is a single layer disposed on a part of each of the pads exposed from the passivation film, and on the passivation film.

According to this embodiment, because the bump covers the pad in a manner being disposed on the passivation film, it is possible to prevent water from permeating to the pad. Moreover, the effect of preventing water permeation is high because the pad is covered by a single layer.

(2) This semiconductor wafer may comprise a second layer formed on a surface of each of the bumps.

(3) A semiconductor chip according to an embodiment of the present invention comprises:

an integrated circuit;

a plurality of pads electrically connected to the integrated circuit;

a passivation film covering a part of each of the pads and exposing the other part of each of the pads; and bumps formed on the pads, respectively, wherein each of the bumps is a single layer disposed on a part of each of the pads exposed from the passivation film, and on the passivation film.

According to this embodiment, because the bump covers the pad in a manner being disposed on the passivation film, it is possible to prevent water from permeating to the pad. Moreover, the effect of preventing water permeation is high because the pad is covered by a single layer.

(4) This semiconductor chip may comprise a second layer formed on a surface of each of the bumps.

(5) A semiconductor device according to an embodiment of the present invention comprising:

a semiconductor chip;

a substrate on which the semiconductor chip is mounted; and an external terminal.

(6) A circuit board according to an embodiment of the present invention has the above semiconductor chip mounted thereon.

(7) A circuit board according to an embodiment of the present invention has the above semiconductor device mounted thereon.

(8) An electronic instrument according to an embodiment of the present invention has the above semiconductor device.

(9) A method of manufacturing a semiconductor chip according to an embodiment of the present invention comprises:

forming a resist layer having an opening over a central portion of a pad, on a passivation film covering the pad;

etching the resist layer to enlarge the opening while etching the passivation film using the resist layer as a mask to expose the central portion of the pad with an end portion of the pad kept covered; and forming a single-layer bump on the central portion of the pad and on the passivation film in the enlarged opening of the resist layer, by electroless plating.

According to this embodiment, because the bump covers the pad in a manner being disposed on the passivation film, it is possible to prevent water from permeating to the pad. Moreover, the effect of preventing water permeation is high because the bump is of the single layer.

(10) In the method of manufacturing a semiconductor chip, etching may be performed on a surface of the resist layer in the opening.

(11) In this method of manufacturing a semiconductor chip, an etching having chemical etching effect and physical etching effect may be applied so that the passivation film is etched more by the physical etching effect rather than by the chemical etching effect and the resist layer is etched more by the chemical etching effect rather than by the physical etching effect.

(12) In the method of manufacturing a semiconductor chip, may be further included an application, after enlarging the opening in the resist layer, of second etching lower in physical etching effect than the etching to further enlarge the opening in the resist layer.

(13) A method of manufacturing a semiconductor chip according to an embodiment of the present invention comprises:

forming a resist layer having an opening over a central portion of a pad, on a passivation film covering the pad;

etching the passivation film using the resist layer as a mask to expose the central portion of the pad with an end portion of the pad kept covered;

etching the resist layer to enlarge the opening; and forming a single-layer bump on the central portion of the pad and on the passivation film in the enlarged opening of the resist layer, by electroless plating.

According to this embodiment, because the bump covers the pad in a manner being disposed on the passivation film, it is possible to prevent water from permeating to the pad. Moreover, the effect of preventing water permeation is high because the bump is of the single layer.

(14) A method of manufacturing a semiconductor chip according to an embodiment of the present invention comprises:

forming a resist layer having an opening over a central portion of a pad, on a passivation film covering the pad;

first etching for etching the passivation film using the resist layer as a mask to expose the central portion of the pad with an end portion of the pad kept covered;

second etching for etching the resist layer except a lower end portion of the resist layer to enlarge the opening;

third etching for etching the lower end portion of the resist layer to enlarge the opening; and forming a single-layer bump on the central portion of the pad and on the passivation film in the enlarged opening of the resist layer, by electroless plating.

According to this embodiment, because the bump covers the pad in a manner being disposed on the passivation film, it is possible to prevent water from permeating to the pad. Moreover, the effect of preventing water permeation is high because the bump is of the single layer.

(15) In the method of manufacturing a semiconductor chip, the second etching may have a higher etching rate on the resist layer than the third etching.

(16) In the method of manufacturing a semiconductor chip, the third etching may have a higher etching selective ratio in the resist layer to the passivation layer than the second etching.

(17) A method of manufacturing a semiconductor chip according to an embodiment of the present invention comprises:

forming a first resist layer having a first opening over a central portion of a pad, on a passivation film covering the pad;

etching the passivation film using the first resist layer as a mask to expose the central portion of the pad with an end portion of the pad kept covered;

removing the first resist layer;

forming a second resist layer having a second opening greater than the central portion of the pad so that the central portion of the pad and part of the passivation film are placed in the second opening; and forming a single-layer bump on the central portion of the pad and on the passivation film in the second opening of the second resist layer, by electroless plating.

According to this embodiment, because the bump covers the pad in a manner being disposed on the passivation film, it is possible to prevent water from permeating to the pad. Moreover, the effect of preventing water permeation is high because the bump is of the single layer.

(18) A method of forming a wiring board according to an embodiment of the present invention comprises:

forming a resist layer on an insulating film covering a land which is a part of an interconnecting pattern, the resist layer having an opening over a central portion of the land;

etching the resist layer to enlarge the opening while etching the insulating film using the resist layer as a mask to expose the central portion of the land with an end portion of the land kept covered; and forming a single-layer bump on the central portion of the land and on the insulating film in the enlarged opening of the resist layer, by electroless plating.

According to this embodiment, because the bump covers the land in a manner being disposed on the insulating film, it is possible to prevent water from permeating to the land. Moreover, the effect of preventing water permeation is high because the bump is of the single layer.

(19) In the method of manufacturing a wiring board, etching may be performed on a surface of the resist layer in the opening.

(20) In the method of manufacturing a wiring board, an etching having chemical etching effect and physical etching effect may be applied so that the insulating film is etched more by the physical etching effect rather than by the chemical etching effect and the resist layer is etched more by the chemical etching effect rather than by the physical etching effect.

(21) This method of manufacturing a wiring board, may further comprise applying a second etching having a physical etching effect lower than the etching to further enlarge the opening of the resist layer, after enlarging the opening of the resist layer.

(22) A method of forming a wiring board according to an embodiment of the present invention comprises:

forming a resist layer on an insulating film covering a land which is a part of an interconnecting pattern, the resist layer having an opening over a central portion of the land;

etching the insulating film using the resist layer as a mask to expose the central portion of the land with an end portion of the land kept covered; and etching the resist layer to enlarge the opening; and forming a single-layer bump on the central portion of the land and on the insulating film in the enlarged opening of the resist layer, by electroless plating.

According to this embodiment, because the bump covers the land in a manner being disposed on the insulating film, it is possible to prevent water from permeating to the land. Moreover, the effect of preventing water permeation is high because the bump is of the single layer.

(23) A method of forming a wiring board according to an embodiment of the present invention comprises:

forming a resist layer on an insulating film covering a land which is a part of an interconnecting pattern, the resist layer having an opening over a central portion of the land;

first etching for etching the insulating film using the resist layer as a mask to expose the central portion of the land with an end portion of the land kept covered;

second etching for etching the resist layer except a lower end portion of the resist layer to enlarge the opening;

third etching for etching the lower end portion of the resist layer to enlarge the opening; and forming a single-layer bump on the central portion of the land and on the insulating film in the enlarged opening of the resist layer, by electroless plating.

According to this embodiment, because the bump covers the land in a manner being disposed on the insulating film, it is possible to prevent water from permeating to the land. Moreover, the effect of preventing water permeation is high because the bump is of the single layer.

(24) In the method of manufacturing a wiring board, the second etching may have a higher etching rate on the resist layer than the third etching.

(25) In the method of manufacturing a wiring board, the third etching may have a higher etching selective ratio in the resist layer to the passivation layer than the second etching.

(26) A method of manufacturing a wiring board according to an embodiment of the present invention comprises:

forming a first resist layer on an insulating film covering a land which is a part of an interconnecting pattern, the first resist layer having a first opening over a central portion of the land;

etching the insulating film using the first resist layer as a mask to expose the central portion of the land with an end portion of the land kept covered;

removing the first resist layer;

forming a second resist layer having a second opening greater than the central portion of the land so that the central portion of the land and part of the insulating film are placed in the second opening; and forming a single-layer bump on the central portion of the land and on the insulating film in the second opening of the second resist layer, by electroless plating.

According to this embodiment, because the bump covers the land in a manner being disposed on the insulating film, it is possible to prevent water from permeating to the land. Moreover, the effect of preventing water permeation is high because the bump is of the single layer.

(27) A wiring board according to an embodiment of the present invention comprises:

an interconnecting pattern having a land;

an insulating film covering a part of the land and exposing the other part of the land; and a bump formed on the land, wherein the bump is a single layer disposed on a part of the land exposed from the insulating film, and on the insulating film.

According to this embodiment, because the bump covers the land in a manner being disposed on the insulating film, it is possible to prevent water from permeating to the land. Moreover, the effect of preventing water permeation is high because the land is covered by a single layer bump.

Embodiments of the present invention will now be explained with reference to the drawings.

First Embodiment

FIGS. 1A to 1D describe a method of manufacturing a semiconductor chip according to a first embodiment of the present invention. In this embodiment, a semiconductor wafer 10 has pads 12 on a main body (semiconductor substrate and insulating film thereon). First, as shown in FIG. 1A, a resist layer 20 is formed on a passivation film (protective insulating film) 14 covering the pads 12. The pad 12 may be formed of aluminum, for example. The pad 12 is electrically connected to an integrated circuit 16 (see FIG. 2) provided in the main body (semiconductor substrate and insulating film thereon) or on the semiconductor substrate. A plurality of integrated circuits 16 are formed on the semiconductor wafer 10 (see FIG. 2). The semiconductor wafer 10 is to be cut (e.g. by dicing or scribing) into a plurality of semiconductor chips, so that each semiconductor chip has an integrated circuit 16. The main body of the semiconductor wafer 10 has integrated circuits 16, and has a transistor and an interlayer dielectric protecting the transistor. The pads 12 are provided above the interlayer dielectric. The passivation film 14 is formed over the main body of the semiconductor wafer 10 and the pads 12. The passivation film 14 may be in an uppermost layer on the semiconductor wafer 10. The passivation film 14 may be formed by a CVD (chemical vapor deposition) method.

The passivation film 14 may be formed avoiding an area over cutting lines (e.g. dicing or scribing lines). The passivation film 14 can be formed of $SiO_2$, SiN or a resin such as polyimide. The passivation film 14 may be formed as a single layer or plural layers.

The resist layer 20 may be formed of a material sensitive to energy (light, electron ray, X-ray or the like). The resist layer 20 maybe of a photosensitive polyimide resin. The resist layer 20 has an opening 22 over a part (e.g. central portion) of the pad 12. In forming an opening 22, lithography (e.g. photolithography) may be applied.

Figure 1B:
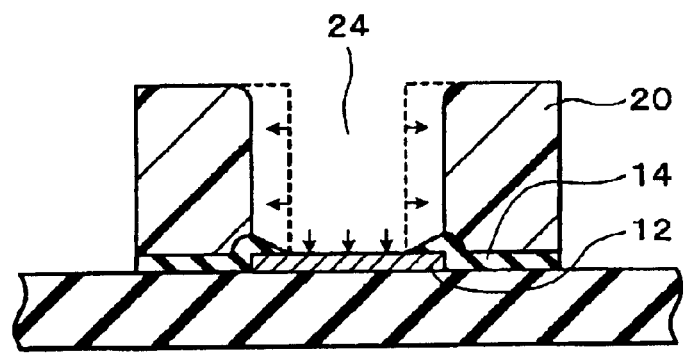

As shown in FIG. 1B, etching is made through the resist layer 20 as a mask to form an opening 22 in the passivation film 14. Etching may use any of wet etching and dry etching.

Etching is performed on the passivation film 14 to expose a part (e.g. central portion) of the pad 12 with another part (e.g. end portion) of the pad 12 kept covered. Namely, an opening is formed in the passivation film 14 on the pad 12, to an area smaller than an area of an upper surface of the pad 12 (surface on which the passivation film 14 is provided). The passivation film 14 may be etched by dry or wet etching. By etching part of the passivation film 14 due to dry etching with high anisotropy, e.g. dry etching (e.g. reactive ion etching) using an etching gas containing Ar or $CF_4$, etching is possible with high anisotropy.

The opening in the passivation film 14 may be made by using dry etching (e.g. reactive ion etching) using, as an etching gas, a mixture gas of Ar or $CF_4$ and $O_2$. For example, in an etching gas containing $O_2$ and $CF_4$, an etching condition may use a ratio of $O_2$ and $CF_4$ in a range as:

$O_2:CF_4=2:1$ to $1:5$ preferably, $O_2:CF_4=2:1$ to $1:2$.

In a single wafer etching, pressure may be 80 to 250 Pa and Rf power be 100 to 200 W, approximately. In the case the passivation film 14 is an $SiO_2$ film, wet etching and dry etching may be applied. When the passivation film 14 includes an SiN film, dry etching is mainly applied. However, where tapering is required, wet etching may also be used. When the passivation film (insulating film) 14 is structured with a plurality of layers, wet etching and dry etching may be properly used.

Meanwhile, in a part of the resist layer 20 having the opening 22, an opening 24 is provided greater in opening area than the opening 22. The opening area refers to an opening area in the resist layer 20 at a side contacting with the passivation film 14. The resist layer 20 maybe etched such that the opening 22 is enlarged greater than part of the pad 12 (e.g. central portion). Namely, the opening 24 may be formed such that its opening area is greater than an area of the upper surface of the pad 12 (surface on which the passivation film 14 is formed). The surface of resist layer 20 in the opening 22 may be etched. The resist layer 20 may be etched by etching high in isotropy rather than anisotropy. For example, with plasma dry etching using an etching gas containing $O_2$ (e.g. reactive ion etching, plasma etching using an oxygen plasma), the resist layer 20 can be etched due to reaction of a reactive gas with the resist layer 20. In case plasma dry etching using an oxygen plasma is used, reactive gas is activated by an oxygen radical to increase the etching rate on the resist layer 20. In this case, by changing the etching condition, the resist layer 20 may be isotropically etched and controlled in retraction by a predetermined range amount. Namely, by further isotropically etching the resist layer 20, an opening 24 may be formed in a manner laterally broadening the opening 22 provided in the resist layer 20. Meanwhile, the resist layer at around the opening 22 may be removed by dry etching having high anisotropy. Due to this, it is easy to control an opening form.

In this embodiment, the etching on the passivation film 14 and the etching for enlarging the opening 22 in the resist layer 20 may be carried out in the same step, or by different steps as in the above.

After ending the etching, the passivation film 14 protrudes in the enlarged opening 24. The area of the opening 24 may be greater than the opening area of the opening of the passivation film 14 on the pad 12. Namely, at the inside of the enlarged opening 24, the pad 12 at its part (e.g. central portion) is exposed from the passivation film 14 while the passivation film 14 is disposed on the other part (e.g. end portion) of the pad 12. The passivation film 14 may be provided with a taper in a somewhat extent. Namely, the passivation film 14 in its region covering the pad 12 may be slanted obliquely upward from the exposed part (e.g. central portion) of the pad 12. Namely, the opening in the passivation film 14 may have an area increasing in a direction from the pad 12 toward the resist layer 20. The pad 12, at its side surface, is covered by the passivation film 14. The resist layer 20 serves as a member to regulate a growth direction in electroless plating. Prior to the next electroless plating method, the resist layer 20 may be cured by UV radiation or the like.

Figure 1C:
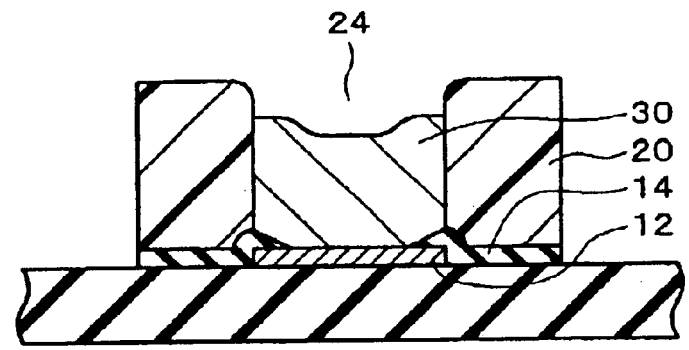

As shown in FIG. 1C, a bump 30 is formed by electroless plating. For example, in the opening 24 of the resist layer 20, a zincate method is carried out on an exposed surface of an Al-formed pad 12 from the passivation film 14. For example, a semiconductor wafer 10 is immersed in a treating solution containing a Zn ion to substitute Al to Zn by the following reaction:

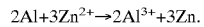

$$2Al+3Zn^{2+} \rightarrow 2Al^{3+}+3Zn.$$

Due to this, the pad 12 at its exposure surface is substituted into Zn. Thereafter, the semiconductor wafer 10 maybe immersed in an electroless Ni plating solution (solution based on Ni ions, reducing agent (generally, Na hyposulfite), stabilizer and buffer), to deposit Ni by way of substitution reaction of Zn and Ni. Otherwise, Al may be immersed in a palladium solution selectively absorbed solely on Al, and thereafter immersed in an electroless Ni plating solution to precipitate Ni on palladium as nucleus.

The precipitation metal (e.g. Ni) by electroless plating spreads laterally of the exposed surface of the pad 12, and extends over the passivation film 14 to be blocked from laterally spreading by the inner surface of the resist layer 20. In a case that the surface of the resist layer 20 in the opening 24 rises vertically relative to the pad 12, it is possible to form a bump 30 in a vertically-rising form. In the case that an upper end portion of the surface of the resist layer 20 in the opening 24 is slanted by the foregoing etching, electroless Ni plating maybe ended in a region in which the inner surface rises vertically (region having high straightness).

In this manner, a single-layer bump 30 can be formed on apart (e.g. central portion) of the pad 12 and on the passivation film 14, in the enlarged opening 24 of the resist layer 20. Because the bump 30 covers the pad 12 in a manner being disposed on the passivation film 14, it is possible to prevent water from permeating to the pad 12. Moreover, the bump 30 made in a single layer provides a great effect in preventing against water permeation. The bump 30, disposed on the passivation film 14, may be recessed in its upper surface. In such a case, the upper end of the bump 30 may be made to be easily crushed.

Figure 1D:
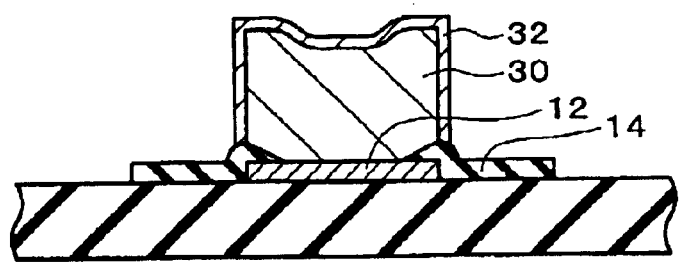

Then, as shown in FIG. 1D, the resist layer 20 is removed away. A second layer 32 may be formed on the bump 30. The second layer 32 maybe formed by electroless plating. The second layer 32 may be formed of Au. For example, the semiconductor wafer 10 may be immersed in a plating solution (solution based on Au ions, reducing agent, stabilizer and buffer) to be subjected to electroless Au plating. The time period of plating may be controlled to an Au self-precipitation amount of 0.4 μm or greater. Namely, because the precipitation rate in Au plating is extremely low as compared to the precipitation rate in Ni plating, plating may be ended when the thickness of the second layer 32 reaches 0.4 μm or grater. By the following cleaning, a second layer 32 can be formed. The Au-formed second layer 32 provides favorable electrical connection. The second layer 32 may be formed in a manner being disposed on the passivation film 32. The second layer 32 may also be formed in a manner sealing the bump 30.

In this embodiment, different plating solutions are used to precipitate and grow two or more layers of different metals, by which electroless plating a bump is formed. For plating materials, those having efficiency can be selected in consideration of plating growth rate, resistance, connectability and the like. Because Au-plating precipitation rate is low as compared to Ni-plating precipitation rate, the bump 30 and second layer 32 may be formed of Ni to 99% of the total height of them.

In the electroless plating method, in case the treatment solution is contacted also with a backside of the semiconductor wafer 10, an electric conduction path is formed to the ground potential (or unstable potential), thus possibly making each pad 12 potentially unstable (ground effect). For this reason, the treatment solution concerning plating may be contacted with only the main surface (surface to form a bump 30) of the semiconductor wafer 10. Namely, measures may be taken not to contact the treatment solutions, for zincate, electroless Ni plating and electroless Au plating, with other parts of the semiconductor wafer 10 than the main surface. For example, where using a dip-type treatment tank, a holder may be used to seal the backside of the semiconductor wafer 10 or resist be applied to the backside not to cause damage to the main surface of the semiconductor wafer 10. Otherwise, a cup type may be applied that the semiconductor wafer 10 at its main-surface outer periphery is abutted against a treatment-solution cup. Other countermeasures may be taken. This can prevent against the affection of ground effect freely from affection of pad potential, in respect of zincate and various electroless plating methods.

The present embodiment forms a bump 30 by electroless plating greatly reduced in step as compared to electrolytic plating. Meanwhile, the resist 30 once formed can be used as a mask in etching the passivation film (insulating film) 14, which on the other hand serves as a member to regulate a growth direction in electroless plating. This greatly reduces the manufacturing step into rationalization, thus enhancing manufacturing efficiency and reliability. Meanwhile, because of unnecessity of again applying resist and patterning thereof, there is no need for a region to cope with positional deviation thus readily realizing a bump compatible with narrowed pitch.

Incidentally, the bump 30 as a modification may be formed of Cu. In such a case, a semiconductor wafer 10 may be immersed in a plating solution based on Cu ions, reducing agent, stabilizer and buffer, to cause self-precipitation of Cu. Also, the second layer 32 may be formed of Sn in place of Au.

Figure 2:
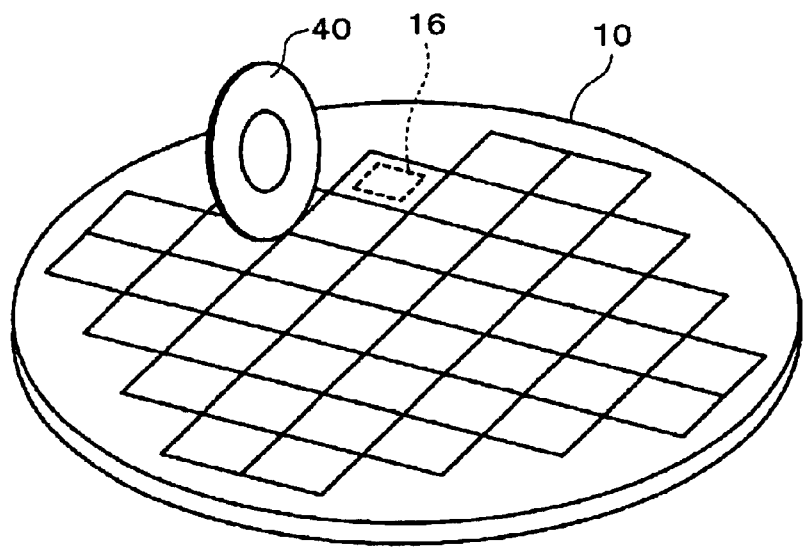
FIG. 2 describes the method of manufacturing a semiconductor chip according to the first embodiment of the present invention.

As shown in FIG. 2, the semiconductor wafer 10 is cut by a tool (cutter, such as a dicer, or a scriber) 40, to obtain individual semiconductor chips. Incidentally, the foregoing step may be carried out on a semiconductor chip to form a bump 30.

The semiconductor wafer 10, processed through the above step, has a plurality of integrated circuits 16. The respective integrated circuits 16 are electrically connected with a plurality of pads 12. The passivation film 14 covers a part (e.g. central portion) of each pad 12 while exposing the other part thereof. The respective pads 12 are formed with bumps 30. Part of the bump 30 is a single layer disposed on an exposed portion of the pad 12 from the passivation film 14 and on the passivation film 14. The bump 30 has the second layer 32 formed on a surface thereof.

Figure 3:
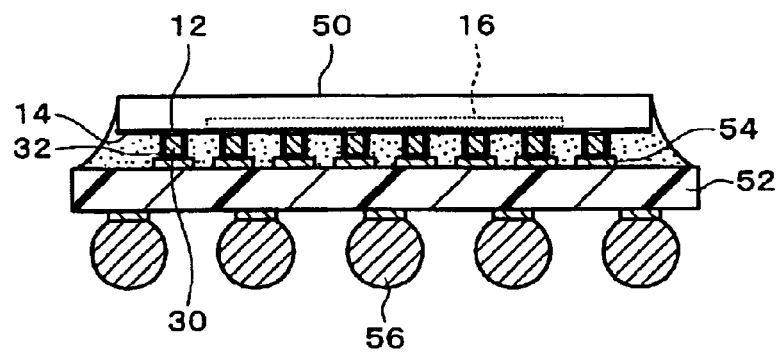
FIG. 3 shows a semiconductor device according to the first embodiment of the present invention.

FIG. 3 shows a semiconductor device according to the first embodiment of the present invention. The semiconductor device has a semiconductor chip 50. The semiconductor chip 50 has an integrated circuit 16. The integrated circuit 16 is electrically connected with a plurality of pads 12. A passivation film 14 covers part of each pad 12 (e.g. central portion) while exposing the other part thereof. Each pad 12 is formed with a bump 30. Part of the bump 30 is a single layer disposed on an exposed part of the pad 12 from the passivation film 14 and on the passivation film 14. The bump 30 may have a second layer 32 formed on a surface thereof.

The semiconductor chip 50 is mounted (e.g. bonded face down) on a substrate (e.g. ceramic board, flexible circuit board or the like) 52. The substrate 52 is formed with an interconnecting pattern 54. The interconnecting pattern 54 and the bumps 30 are electrically connected together. In the case that an anisotropic conductive material (anisotropic conductive film or paste) is used in electrical connection between the interconnecting pattern 54 and the bumps 30 and the bump 30 or second layer 32 is recessed in its upper surface, conductive particles are readily trapped in the recess. The bump 30 or second layer 32 while trapping conductive particles is crushed, to provide favorable bonding. This is true for a case with using a conductive material (conductive paste or the like). Metal junction may be applied or insulating adhesive may be used in the electrical connection between the interconnecting pattern 54 and the bumps 30. The substrate 52 may be provided with external terminals (e.g. solder balls) 56.

Figure 4:
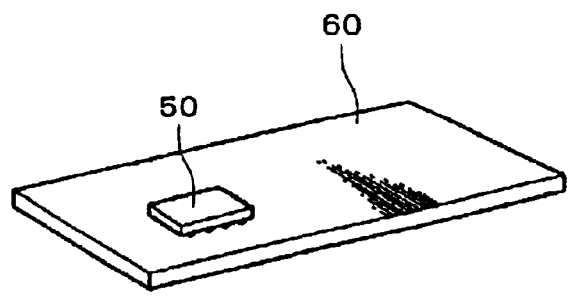
FIG. 4 shows a circuit board mounting thereon a semiconductor chip according to the first embodiment of the present invention.

FIG. 4 shows a circuit board mounting thereon a semiconductor chip according to the first embodiment. The circuit board (mother board) 60 is mounted (e.g. flip-chip bonded) with a semiconductor chip 50 as described in the above. Note that an interconnecting pattern, not shown, is formed on the circuit board 60.

Figure 5:
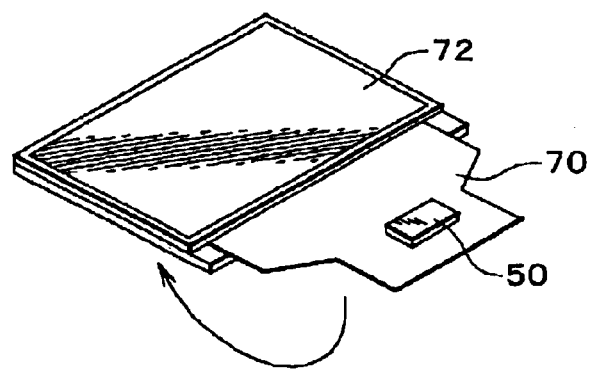
FIG. 5 shows a semiconductor device mounting thereon a semiconductor chip according to the first embodiment of the present invention.

FIG. 5 shows a semiconductor device mounting thereon a semiconductor chip according to the first embodiment of the present invention. The semiconductor device has a semiconductor chip 50 mounted on a circuit board 70, thus structuring a TCP (Tape Carrier Package). The semiconductor device is coupled to an electronic panel (e.g. liquid-crystal panel or electroluminescent panel) 72. Note that the semiconductor chip 50 may be in a mounting form of COG (Chip On Glass) or COF (Chip On Film/Flexible).

Figure 6:
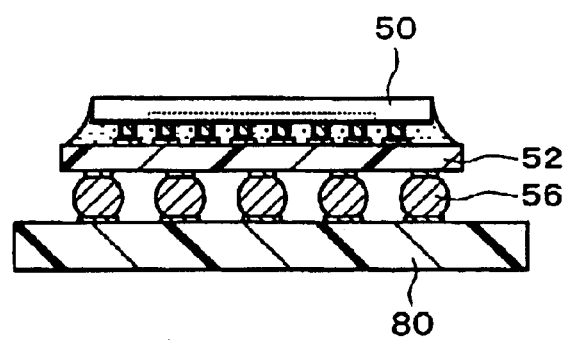
FIG. 6 shows a circuit board mounting thereon the semiconductor device shown in FIG. 3.
Figure 7:
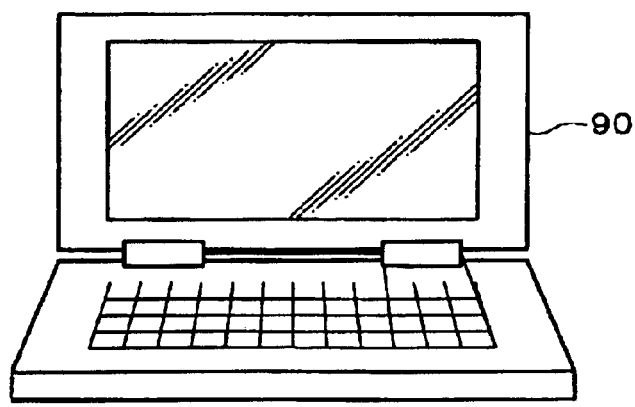
FIG. 7 shows an electronic instrument having a semiconductor device according to an embodiment of the present invention.
Figure 8:
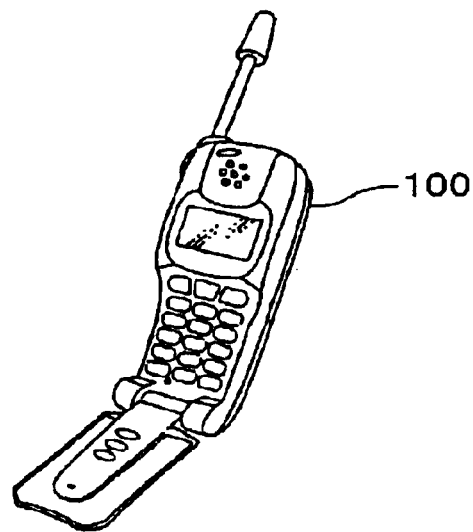
FIG. 8 shows an electronic instrument having a semiconductor device according to an embodiment of the present invention.

FIG. 6 shows a circuit board 80 mounting thereon the semiconductor device shown in FIG. 3. There is shown in FIG. 7 a notebook personal computer 90 and in FIG. 8 a cellular phone 100, as electronic instruments having the semiconductor device to which the invention is applied.

Second Embodiment

Figure 9A:
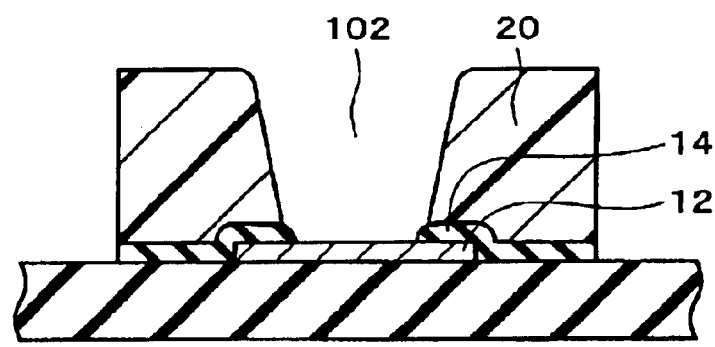
FIGS. 9A to 9B describe a method of manufacturing a semiconductor chip according to a second embodiment of the present invention.
Figure 9B:
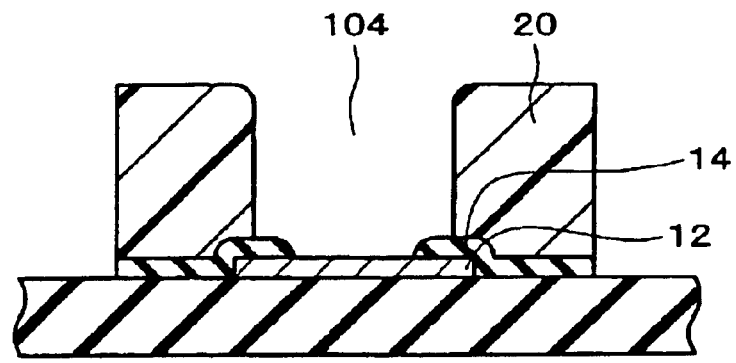

FIGS. 9A to 9B describe a method of manufacturing a semiconductor chip according to a second embodiment of the present invention. In also this embodiment, using as a mask a resist layer 20 having an opening 22 as shown in FIG. 1A, a pad 12 in a part (e.g. central portion) is exposed from a passivation film 14 and a opening 22 in the resist layer 20 is enlarged. This embodiment is different from the first embodiment in that a surface of the resist layer 20 in an enlarged opening 102 is slanted as shown in FIG. 9A. Such slant is caused by etching due to physical etching effect.

For this reason, the present embodiment applies second etching lower in physical etching effect (e.g. higher in chemical etching effect) than the etching for enlarging the opening 22 in the resist layer 20, thereby further enlarging the opening 102 in the resist layer 20. Second etching may apply dry etching, or wet etching to vertically eject an etching solution, by shower, against the pad 12. Second etching may be conducted prior to curing the resist layer 20 by UV radiation. By doing so, an opening 104 can be formed so that a surface of the resist layer 20 in the opening 104 rises vertically relative to the pad 12 as shown in FIG. 9B. Hence, it is possible to form a vertically-rising bump. The present embodiment can also achieve the effect as explained in the first embodiment. Also, the content explained in the first embodiment can be applied for this embodiment. Furthermore, the content explained in this embodiment may be applied for other embodiments.

Third Embodiment

Figure 10A:
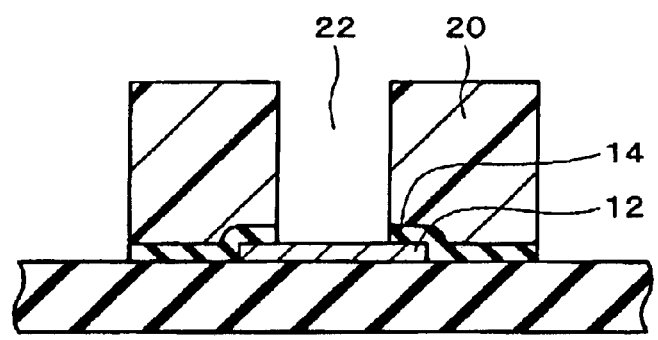
FIGS. 10A to 10B describe a method of manufacturing a semiconductor chip according to a third embodiment of the present invention.
Figure 10B:
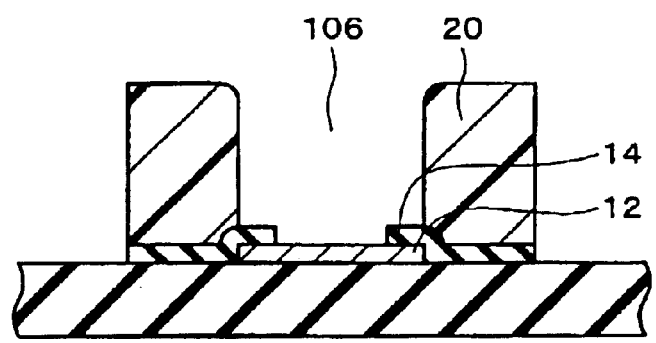

FIGS. 10A to 10B describe a method of manufacturing a semiconductor chip according to a third embodiment of the present invention. In this embodiment, using as a mask a resist layer 20 having an opening 22 as shown in FIG. 1, a passivation film 14 is etched to expose, while covering a part (e.g. end portion) of the pad 12, the other part (e.g. central portion) of the pad 12, as shown in FIG. 10A. This etching may be conducted under an optimal condition for etching the passivation film 14 (e.g. under a condition increasing physical etching effect). The resist layer 20 may not be etched but may be etched.

Next, as shown in FIG. 10B, the resist layer 20 is etched in a manner enlarging the opening 20. This etching may be conducted under an optimal condition for etching the resist layer 20 (e.g. under a condition increasing chemical etching effect) The passivation film 14 may not be etched but may be etched.

Because the present embodiment etches the passivation film 14 and the resist layer 20 under respective optimal conditions, etching can be favorably done. For example, by enlarging the opening 22 in the resist layer 20, it is possible to form an enlarged opening 106 so that a surface of the resist layer 20 in the opening 106 vertically rises relative to the pad 12. Thus, a bump can be formed vertically rising. This embodiment also achieves the effect as explained in the first embodiment. Also, the content explained in the first embodiment can be applied for this embodiment. Furthermore, the content explained in this embodiment may be applied for other embodiments.

Fourth Embodiment

Figure 11A:
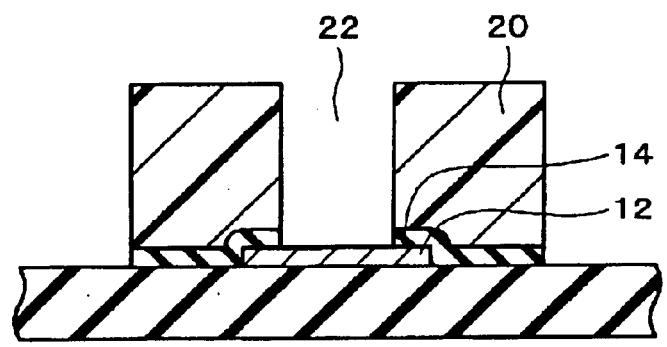
FIGS. 11A to 11C describe a method of manufacturing a semiconductor chip according to a fourth embodiment of the present invention.
Figure 11B:
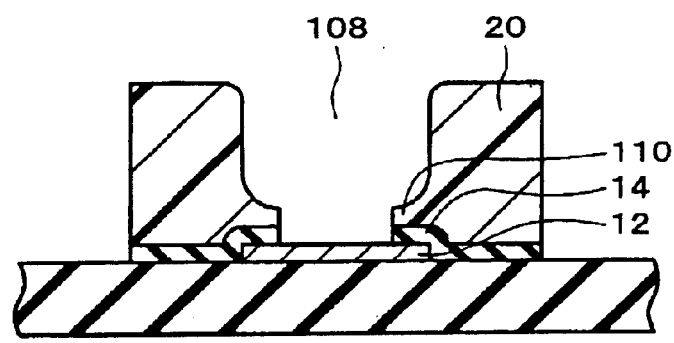

FIGS. 11A to 11B describe a method of manufacturing a semiconductor chip according to a fourth embodiment of the present invention. In this embodiment, using as a mask a resist layer 20 having an opening 22 as shown in FIG. 1A, a passivation film 14 is etched to expose, while covering a part (e.g. end portion) of the pad 12, the other part (e.g. central portion) of the pad 12, as shown in FIG. 11A (first etching). This etching may be conducted under an optimal condition for etching the passivation film 14 (e.g. under a condition increasing physical etching effect) The resist layer 20 may not be etched but may be etched.

Next, as shown in FIG. 11B, the resist layer 20 is etched in a part excepting its lower end 110 to enlarge the opening 22 (second etching). For example, etching is performed on a surface of the resist layer 20 in the opening 22. The lower end 110 of the resist layer 20 may not be etched, but may be etched in an etch amount less than that of the other portion (e.g. upper end and middle portions). In this manner, an opening 108 is formed by enlargement in the resist layer 20. In the opening 108, the hole formed by the lower end 110 of the resist layer 20 is smaller than the hole formed by the portion other than the lower end 110 (e.g. upper end and middle portions) Accordingly, the resist layer 20 at its lower end 110 covers the passivation film 14 (e.g. an upper surface thereof).

Figure 11C:
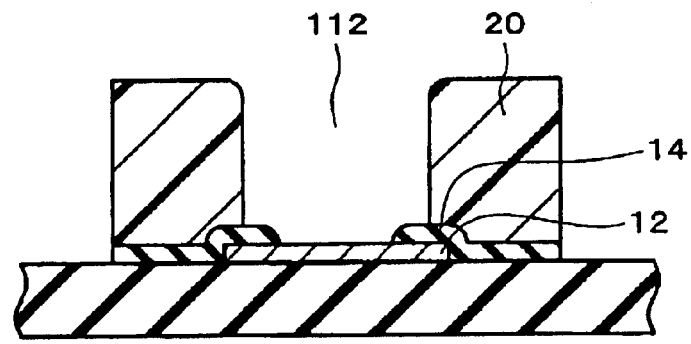

Next, as shown in FIG. 11C, etching is further performed on the lower end 110 of the resist layer 20 to enlarge the opening 108 furthermore (third etching). Third etching may have a greater etch selective ratio of the resist layer 20 to the passivation film 14 than in second etching. In this manner, formed is a further enlarged opening 112 in the resist layer 20. The passivation film 14 protrudes in the opening 112. In third etching, because the passivation film 14 is exposed in the opening 112, applied is a condition having a lower effect upon the passivation film 14 than in second etching.

In this embodiment, the opening 22 is enlarged by two-staged etching (second and third etchings). Second etching may be lower in etch rate on the resist layer 20 than in third etching. Meanwhile, in second etching, the etching selective ratio of the resist layer 20 to the passivation film 14 may be lower than that in third etching. However, although the opening 22 is enlarged into the opening 108, the resist layer 20 at its lower end 110 is left on the passivation film 14. By doing so, there is less effect of etching upon the passivation film 14. Incidentally, second etching may be conducted without etching the passivation film 14 or under a condition of less etching amount thereof.

According to this embodiment, a bump can be formed with reduced effect upon the passivation film 14. The present embodiment can also achieve the effect as explained in the first embodiment. The content explained in the first embodiment may be applied to the present embodiment. Furthermore, the content explained in this embodiment may be applied to other embodiments.

Fifth Embodiment

Figure 12A:
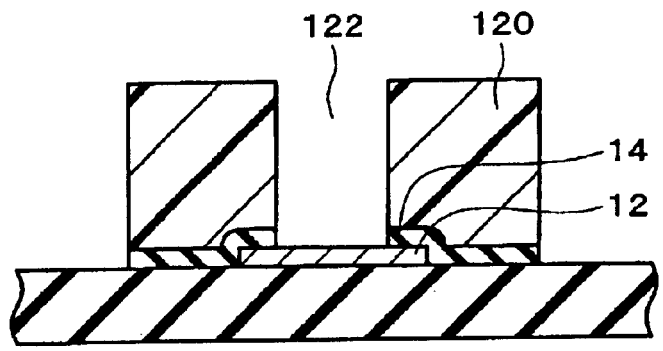
FIGS. 12A to 12B describe a method of manufacturing a semiconductor chip according to a fifth embodiment of the present invention.
Figure 12B:
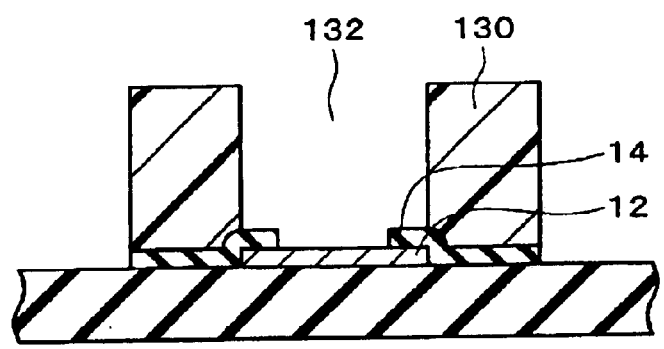

FIGS. 12A to 12B describe a method of manufacturing a semiconductor chip according to a fifth embodiment of the present invention. In this embodiment, on a passivation film 14 covering a pad 12, a first resist layer 120 is formed to have a first opening 122 above a part (e.g. central portion) of the pad 12, as shown in FIG. 12A. The content of the resist layer 20 and opening 22 explained in the first embodiment is true for the first resist layer 120 and opening 122.

Using the first resist layer 120 as a mask, passivation film 14 is etched to expose, while covering a part (e.g. end portion) of the pad 12, the other part (e.g. central portion) of the pad 12. This etching may be conducted under an optimal condition for etching the passivation film 14 (e.g. under a condition increasing physical etching effect). The resist layer 120 may not be etched but may be etched. Then, the first resist layer 120 is removed away.

Next, as shown in FIG. 12B, a second resist layer 130 is formed having a second opening 132 greater than an exposed part (e.g. central portion) of the pad 12 from the passivation film 14. In the second opening 132, arranged are the exposed part (e.g. central portion) of the pad 12 from the passivation film 14 and part of the passivation film 14. In this embodiment, the first resist layer 120 is used upon etching the passivation film 14, to use the second resist layer 130 different from that during forming a bump. Accordingly, the first and second resist layers 120, 130 can be used having optimal forms (openings 122, 132) for the respective steps.

Then, a bump is formed by electroless plating as explained in the first embodiment. This embodiment also can achieve the effect as explained in the first embodiment. Also, the content explained in the first embodiment can be applied for this embodiment. Furthermore, the content explained in this embodiment may be applied to other embodiments.

Sixth Embodiment

Figure 13:
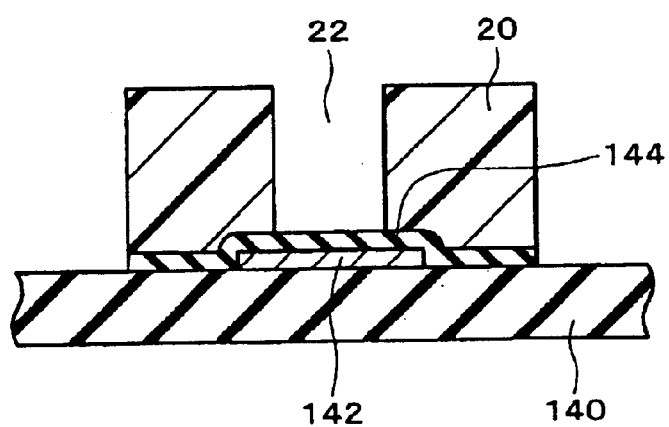
FIG. 13 describes a method of manufacturing a wiring board according to a sixth embodiment of the present invention.
Figure 14:
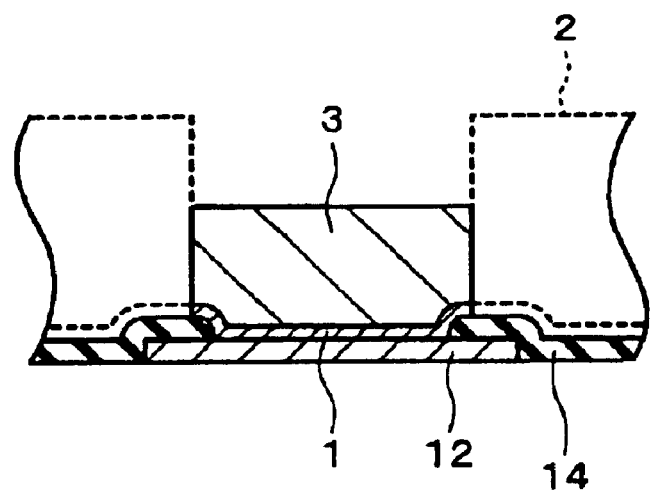
FIG. 14 describes a prior art to the invention.

FIG. 13 shows a method of manufacturing a wiring board according to a sixth embodiment of the present invention. In this embodiment, a land 142 as a part of an interconnecting pattern is formed on a substrate 140. The land 142 is covered with an insulating film (e.g. solder resist layer) 144. Then, a bump is formed on the land 142. The content of this is a content that the pad 12 in the first embodiment is replaced with the land 142 and the passivation film 14 with the insulating film 144. In this manner, it is possible to manufacture a wiring board formed with a bump. This embodiment also can achieve the effect as explained in the first embodiment. Also, the content explained in the first embodiment can be applied for this embodiment. Furthermore, the content explained in this embodiment may be applied to other embodiments.

The invention is not limited to the above embodiments but can be modified in various ways. For example, the invention includes the substantially the same structure (e.g. the same structure in function, method and result or object and result) as the structure explained in the embodiment. Also, the invention includes a structure that a non-essential part is substituted in the structure explained in the embodiment. The invention includes a structure capable of providing the same operation and effect or achieving the same object as the structure explained in the embodiment. Meanwhile, the invention includes a structure that a known art is added to the structure explained in the embodiment.

What is claimed is:

1. A semiconductor wafer comprising:

a plurality of integrated circuits;

a plurality of pads electrically connected to each of the integrated circuits;

a passivation film covering a part of each of the pads and exposing the other part of each of the pads; and a plurality of bumps each respectively disposed on the plurality of pads, and each of the bumps having a recessed portion in an upper surface, each of the bumps having a first layer contiguously disposed directly on the passivation film, and side surfaces of each of the bumps being defined by the first layer, wherein each of the plurality of bumps has a second layer covered by the first layer.

2. The semiconductor wafer as defined by claim 1, wherein each of the bumps is formed by electroless plating.

3. The semiconductor wafer as defined by claim 1, wherein the passivation film in a region covering the pads, is slanted obliquely upward from the exposed part of each of the pads.

4. A semiconductor chip comprising:

an integrated circuit;

a plurality of pads electrically connected to the integrated circuit;

a passivation film covering a part of each of the pads and exposing the other part of each of the pads; and a plurality of bumps each respectively disposed on the plurality of pads, each of the bumps having a recessed portion in an upper surface, each of the bumps having a first layer contiguously disposed directly on the passivation film, and side surfaces of each of the bumps being defined by the first layer, wherein each of the plurality of bumps has a second layer covered by the first layer.

5. A circuit board on which a semiconductor chip as defined by claim 4 is mounted.

6. The semiconductor chip as defined by claim 4, wherein each of the bumps is formed by electroless plating.

7. The semiconductor chip as defined by claim 4, wherein the passivation film in a region covering the pads is slanted obliquely upward from the exposed part of each of the pads.

8. A semiconductor device comprising:

the semiconductor chip as defined by claim 4;

a substrate on which the semiconductor chip is mounted; and an external terminal.

9. A circuit board on which a semiconductor device as defined by claim 8 is mounted.

10. An electronic instrument having a semiconductor device as defined by claim 8.

11. A wiring board comprising:

an interconnecting pattern having a land;

an insulating film covering a part of the land and exposing the other part of the land; and a bump disposed on the land, the bump having a recessed portion in an upper surface, the bump having a first layer contiguously disposed directly on the passivation film, the bump having side surfaces, each of the side surfaces defined by the first layer, wherein each of the plurality of bumps has a second layer covered by the first layer.

12. The wiring board as defined by claim 11, wherein the bump is formed by electroless plating.

13. The wiring board as defined by claim 11, wherein the passivation film in a region covering the pad is slanted obliquely upward from the exposed part of the pad.

* * * * *